(12) United States Patent
Vandergrift et al.

(10) Patent No.: US 11,342,743 B2
(45) Date of Patent: May 24, 2022

(54) CURRENT LIMITING CIRCUIT FOR A CONTROL CIRCUIT FOR CONTROLLING A SEMICONDUCTOR SWITCH SYSTEM

(71) Applicant: Hamilton Sundstrand Corporation, Charlotte, NC (US)

(72) Inventors: Adrian E. Vandergrift, Rockton, IL (US); Arthur J. Beneditz, Rockford, IL (US); Lon R. Hoegberg, Belvidere, IL (US); Brennan Fox, Geneseo, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/791,008

(22) Filed: Feb. 14, 2020

(65) Prior Publication Data
US 2021/0257831 A1   Aug. 19, 2021

(51) Int. Cl.
| G05F 1/573 | (2006.01) |
| H03K 17/082 | (2006.01) |
| H03K 17/18 | (2006.01) |
| H02H 9/02 | (2006.01) |
| H02H 1/00 | (2006.01) |
| H03K 17/08 | (2006.01) |

(52) U.S. Cl.
CPC ............ *H02H 9/02* (2013.01); *H02H 1/0007* (2013.01); *H03K 17/08* (2013.01); *G05F 1/573* (2013.01); *H03K 17/082* (2013.01); *H03K 17/0822* (2013.01); *H03K 17/0826* (2013.01); *H03K 17/18* (2013.01)

(58) Field of Classification Search
CPC .. G05F 1/573; H03K 17/082; H03K 17/0822; H03K 17/0826; H03K 17/18

USPC ................. 323/276–278, 289; 361/63, 93.9
See application file for complete search history.

(56) References Cited

U.S. PATENT DOCUMENTS

| 5,926,010 | A | 7/1999 | Hosokawa et al. |
| 6,307,726 | B1 * | 10/2001 | Marshall ............ H03K 17/0822 361/93.1 |
| 7,679,876 | B2 | 3/2010 | Ong et al. |
| 8,040,652 | B2 | 10/2011 | Forghani-zadeh et al. |
| 8,218,281 | B2 | 7/2012 | Vandergrift |
| 9,063,558 | B2 | 6/2015 | Fukumura |
| 2006/0152875 | A1 | 7/2006 | Chen et al. |
| 2007/0008672 | A1 | 1/2007 | Ohshima |
| 2008/0106152 | A1 * | 5/2008 | Maier ..................... G05F 1/569 307/130 |
| 2010/0290167 | A1 * | 11/2010 | Vandergrift ........ H03K 17/0822 361/101 |

(Continued)

FOREIGN PATENT DOCUMENTS

| EP | 2254246 A1 | 11/2010 |
| EP | 1876710 | 6/2011 |

OTHER PUBLICATIONS

European Search Report for Application No. 20213799.8 dated May 26, 2021.

*Primary Examiner* — Gary A Nash
(74) *Attorney, Agent, or Firm* — Carlson, Gaskey & Olds, P.C.

(57) ABSTRACT

A power distribution system and method has a controller and at least one semiconductor switch. The power distribution system additionally has an on status detector which detects the status of the semiconductor switches, and an overcurrent status circuit which checks for overcurrent conditions.

14 Claims, 3 Drawing Sheets

(56) References Cited

U.S. PATENT DOCUMENTS

| | | | |
|---|---|---|---|
| 2014/0355161 A1* | 12/2014 | Torres | H02H 9/02 361/93.9 |
| 2016/0308351 A1* | 10/2016 | Lim | H02H 9/023 |
| 2018/0191149 A1* | 7/2018 | Li | H02H 3/087 |

* cited by examiner

CURRENT LIMITING CIRCUIT FOR A CONTROL CIRCUIT FOR CONTROLLING A SEMICONDUCTOR SWITCH SYSTEM

BACKGROUND OF THE INVENTION

This application relates generally to power distribution systems, and more specifically to overcurrent protection in DC power distribution systems.

In power distribution systems where DC power is distributed to multiple different loads, it is known to use a set of switches/relays in conjunction with a power system controller to control the power flowing to each load. In order to facilitate operation and power distribution to all of the loads, a controller, which is capable of controlling the state of each of the switches/relays in the system, is typically utilized.

Initially, systems designed in this way used mechanical relay switches. However, mechanical relay systems suffered from reliability problems. In order to improve reliability, many applications now use semiconductor switches instead of mechanical relays due to a longer life-span of the semiconductor switches. Use of semiconductor switches has the additional benefit of reducing the size of the circuit as well as reducing the weight.

Use of semiconductor switches necessitates a different style of controller than the controller used for mechanical relay switches. Existing semiconductor switch controllers are expensive to construct and maintain, are larger than desirable for use in many systems, such as aircraft power systems, and do not readily scale for different sized loads and trip currents.

SUMMARY OF THE INVENTION

In one exemplary embodiment a power distribution circuit includes a semiconductor switch, a current shunt connected to said semiconductor switch, a current limit circuit connected to a control input of the semiconductor switch and configured to limit a current through the current shunt, an on status detector connected to said semiconductor switch and an on status output line such that a semiconductor on signal is output on said on status output line when said semiconductor switch is on, a controller connected to an input power source and to a control input of said semiconductor switch, and an overcurrent detection circuit connected to said input power source, said semiconductor switch, and an overcurrent status circuit such that said overcurrent detection circuit is capable of detecting an overcurrent fault in said semiconductor switch.

An exemplary method for controlling a switching circuit including the steps of detecting an overcurrent status of said at least one switching component, limiting a current through the at least one switching component in response to detecting an overcurrent status of said at least one switching component using a current limit circuit, and overriding a detected on status of said at least one switching component when an overcurrent status is detected.

These and other features of the present invention can be best understood from the following specification and drawings, the following of which is a brief description.

DETAILED DESCRIPTION OF THE PREFERRED EMBODIMENT

Figure 1:
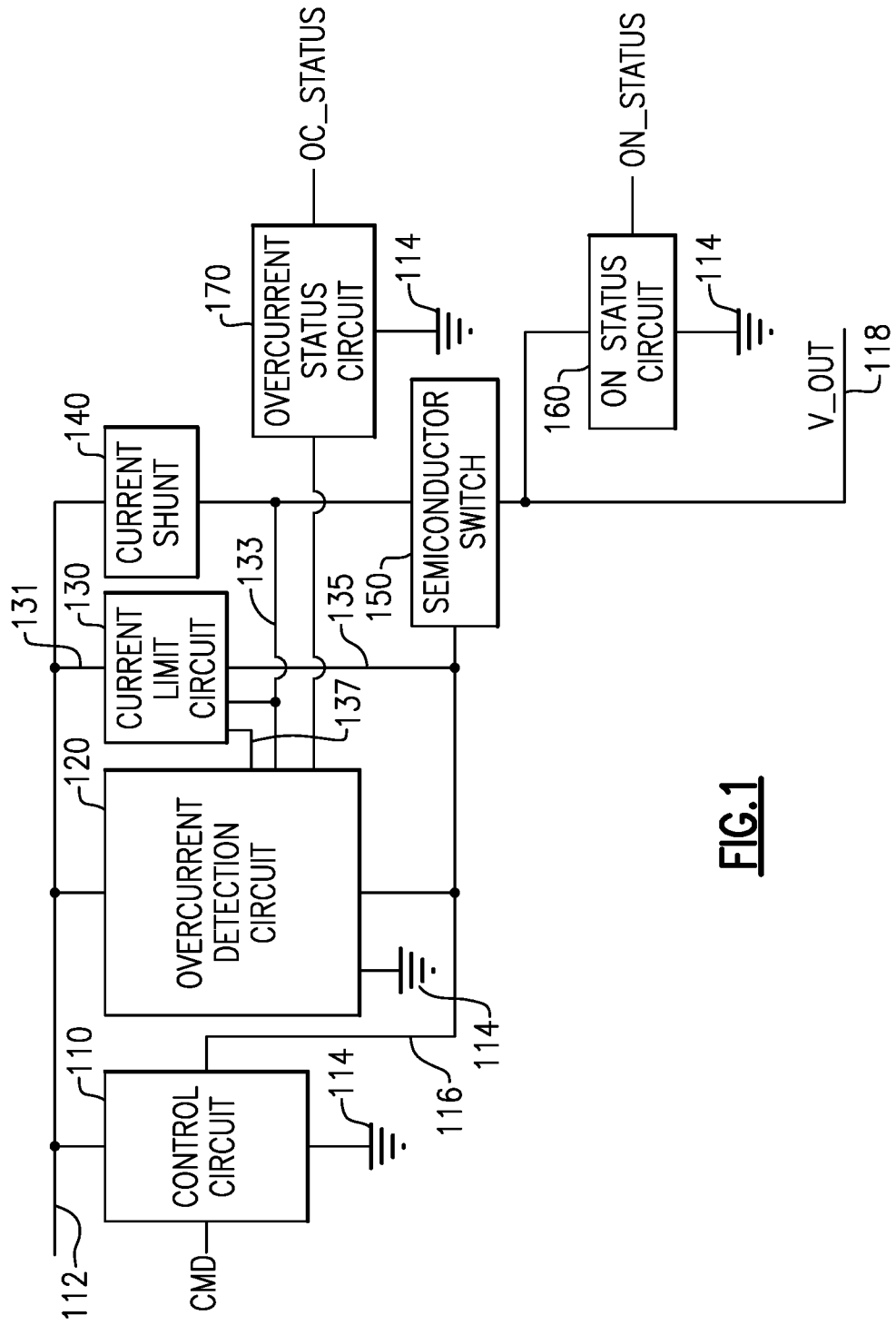
FIG. 1 is a schematic diagram of an example semiconductor control circuit.

When controlling power to multiple DC loads using multiple semiconductor switches in a DC power distribution system, it is necessary for a controller to be able to monitor the state of each semiconductor switch and appropriately respond to any overcurrent conditions. FIG. 1 illustrates a box diagram of an electric circuit capable of controlling and monitoring a semiconductor switch 150. The circuit of FIGS. 1 and 2 could be adapted to control and monitor multiple semiconductor switches using methods known in the art.

Figure 2:
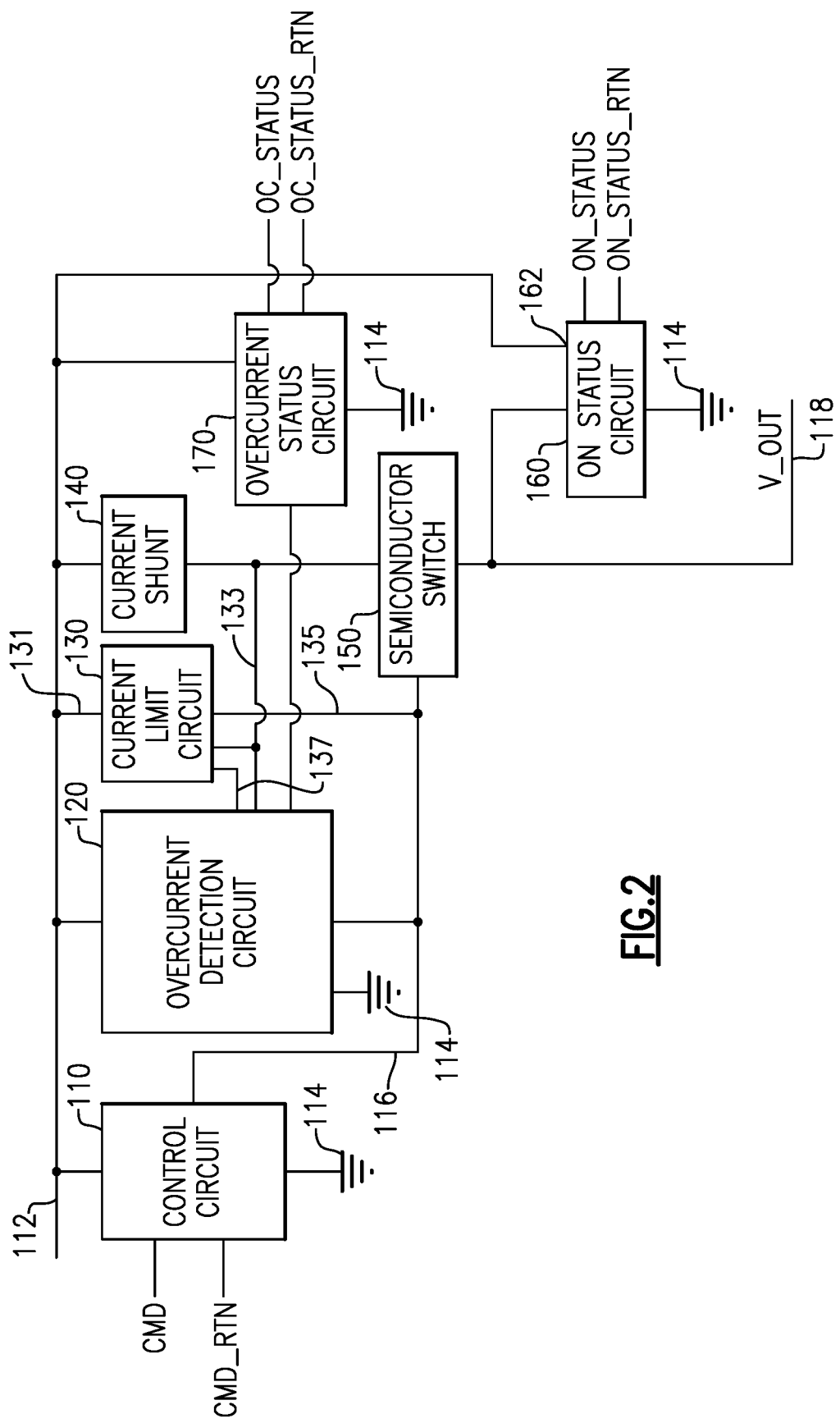
FIG. 2 is a schematic diagram of an example semiconductor control circuit having opto-coupler interface connections.

The example of FIGS. 1 and 2 have a controller 110 connected to a first input power line 112 and to a neutral line 114. The controller 110 additionally has a control output 116 which connects to an overcurrent detection circuit 120, a current limiting circuit 130, and a semiconductor switch 150. The overcurrent detection circuit 120 is connected to the input power line 112, a current limiting circuit 130, a current shunt circuit 140, and an overcurrent status circuit 170. The current limit circuit 130 is also connected to the input power line 112. The semiconductor switch 150 has a gate input which accepts the control signal 116 and has a power input connected to the current shunt 140, and a power output connected to the output voltage signal 118 and to an on status circuit 160.

The solid state controller 110 of FIG. 1 controls the state of the semiconductor switch 150 by using a control signal, an output from the solid state controller 110 on the control signal output line 116. The control signal line 116 voltage is either 10-15V below the input power line 112 voltage, placing the semiconductor switch 150 in an on state, or the control signal line 116 voltage is equal to the power line 112 voltage placing the semiconductor switch 150 in an off state. When the control signal line 116 voltage is 10-15V below the input power line 112 voltage, the semiconductor switch 150 is turned on, and power is allowed to flow from the current shunt 140 through the semiconductor switch 150 to the output voltage 118. Additionally, power simultaneously flows through the semiconductor switch 150 to the on status detection circuit 160.

When the on status circuit 160 detects power flowing from the semiconductor switch 150, the on status circuit 160 begins outputting a semiconductor switch on signal which can used to monitor the status of the semiconductor switch system or for any other purpose. When the semiconductor switch 150 turns off, and thus ceases allowing power to flow through the semiconductor switch 150, the on status detection circuit 160 will no longer detect power, and therefore will cease sending the semiconductor switch on signal. In FIG. 2, the on status circuit 160 has an additional connection 162 to the power line 112. The connection 162 allows the isolated on status circuit 160 to receive power for the optical isolation.

When an overcurrent condition occurs, the semiconductor switch 150, the current shunt 140, and the output wiring are subject to potential damage if the overcurrent condition is allowed to continue indefinitely. To protect the semiconductor switch 150, the current shunt 140, and any output wiring from damage, the example of FIG. 1 includes an overcurrent detection circuit 120 and an overcurrent status circuit 170.

The overcurrent detection circuit 120 detects the current through the current shunt 140. When the overcurrent detection circuit 120 detects a current that exceeds a preset threshold, it determines that an overcurrent condition is present in the circuit. When an overcurrent has been detected, the overcurrent detection circuit 120 clamps the control signal line 116 to about 1.5V less than the power line 112 voltage causing the semiconductor switch 150 to be latched off. After detecting an overcurrent condition, the overcurrent detection circuit 120 also outputs a signal to the overcurrent status circuit 170. Once the overcurrent status circuit 170 receives a signal from the overcurrent detection circuit 120, the overcurrent status circuit 170 switches on and begins outputting an overcurrent detected signal.

The overcurrent detected signal can be used to monitor the status of the semiconductor switch system and detect when an overcurrent event has occurred. The semiconductor switch 150 will remain latched off by the overcurrent detection circuit 120 until the input to the control circuit 110 is removed. Once the input signal has been removed, the overcurrent latch is removed, and the control circuit 110 can be commanded to turn the output on again. If the overcurrent condition still exists, the overcurrent detection circuit 120 will again detect the condition and latch the semiconductor switch 150 off.

The current limit circuit 130 detects the current through the current shunt 140. When the current limit circuit 130 detects that the current reaches a preset threshold, the current limit circuit 130 changes the voltage on the control signal line 116 to control and limit the current through the semiconductor switch 150. The preset threshold for the current limit is higher than the preset threshold for the overcurrent detection circuit ensuring that if the current limit is reached, the overcurrent detection circuit will latch off the semiconductor switch 150.

Existing current limit circuits that can be incorporated in FIGS. 1 and 2 as the current limit circuit 130 include high tolerance ranges that increase the maximum worst case current limit. For some applications, this can result in a maximum worst case current that is well above nominal current limits and can require the usage of excessively large electronic components (e.g. MOSFETs, current sense resistors, output diodes, etc.) that can be exposed to the worst case scenario current.

Figure 3:
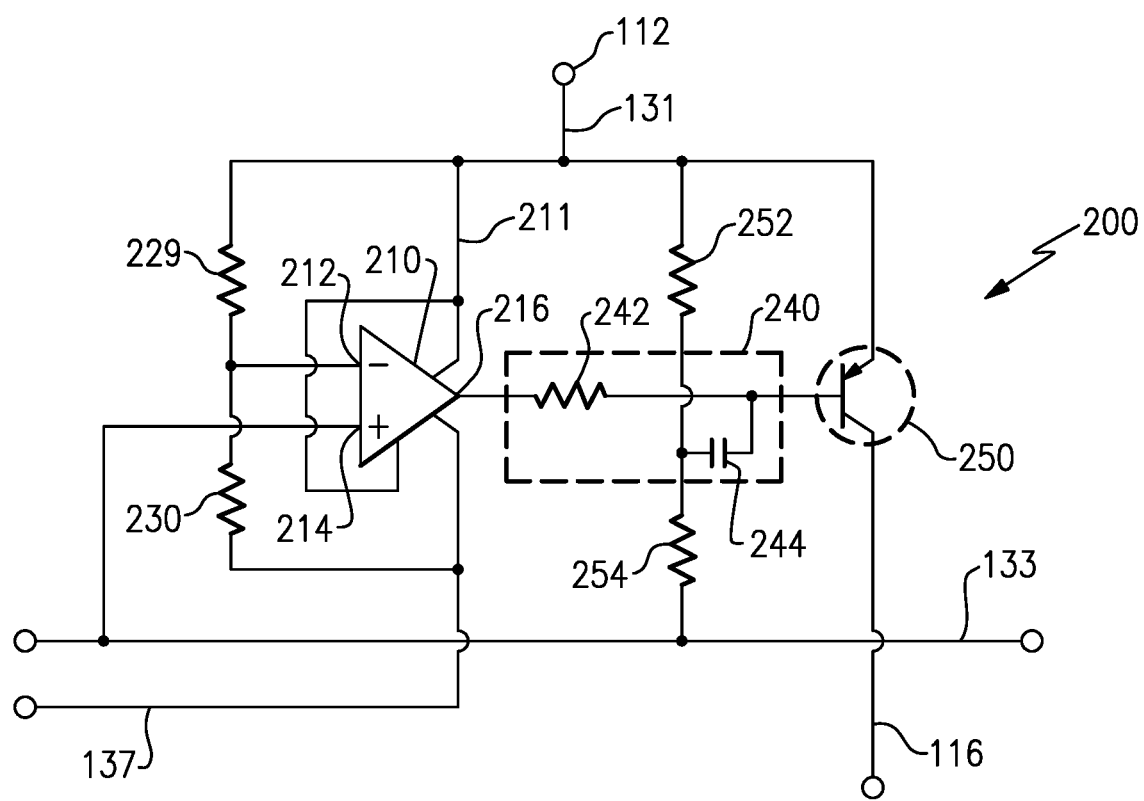
FIG. 3 is a schematic circuit diagram of an example current limit circuit for utilization in the semiconductor control circuit of either FIG. 1 or FIG. 2.

With continued reference to FIGS. 1 and 2, FIG. 3 schematically illustrates a circuit 200 that can be utilized as the current limit circuit 130 within the circuits of FIGS. 1 and 2. The circuit 200 includes an operational amplifier (Op-Amp) 210 and provides precision current limiting. A positive reference voltage is provided to the operational amplifier 210 via a connection 211 to the input power line 112. A pair of resistors 229, 230 are connected to the negative input 212 of the operational amplifier 210 and set a reference voltage of the operational amplifier 210. The first resistor 229 in the pair of resistors 229, 230 connects the first input power line 112 to the negative input 212 of the operational amplifier 210 via a node 131. The second resistor 230 of the pair of resistors 231 connects the negative input 212 of the operational amplifier 210 to a −VCC node in the overcurrent detection circuit 120 via a connection 137. In some examples the −VCC node in the overcurrent detection circuit 120 is the ground 114.

The reference voltage in turn determines the magnitude that the circuit 200 will limit the current to (referred to as the current limit value of the current limiting circuit 200). Voltage from the current shunt 140 is provided back to the positive operational amplifier 210 input 214 via a connection 133.

In order to prevent or minimize glitches and noise, an output filter 240 connects the output 216 of the operational amplifier 210 to a control input of transistor 250. In the illustrated example, the output filter 240 includes a resistor 242 directly connected to the output, and a capacitor 244 connected to the control input. The transistor 250 buffers the operation amplifier 210 and is connected to the control output 116. The control input of the transistor 250 is connected to the input power line 112 via a resistor 252 and to the connection 133 via a resistor 254. The resistors 252, 254 further assist in stabilizing the operational amplifier 210.

By utilizing the operational amplifier 210 based current limit circuit, a precise current limit is applied to the control circuits of FIG. 1 or 2. In one example, the current limit is approximately 11.5 A can provide a precision within a range of +/−1.5 A. In another example, the current limit provided is approximately 28 A, and can provide a precision within the range of +/−3 A. Alternatively, these ranges can be expressed as a percentage deviation from a nominal (i.e. targeted) current limit. In one example, the precision can be at most 20% of the nominal current limit resulting in a current limit within the range of the nominal current limit value plus or minus 20%. In another example, the precision can be at most 15% of the nominal current limit resulting in a current limit within the range of the nominal current limit value plus or minus 15%. In each of these examples, the worst case tolerances of the circuit is substantially reduced, relative to previous configurations.

In an alternative example to that of FIG. 3, the current limit circuit can utilize a comparator in place of the operational amplifier 210 but is otherwise configured in the same manner. In practical implementations a comparator is cheaper and faster than the operational amplifier 210 but sacrifices some of the precision of the overall current limit circuit 200.

It is known that alternate designs could be used for the on status circuit as well as for the overcurrent status circuit, and fall within the above disclosure. Additionally a worker of ordinary skill in this art would recognize that certain modifications would come within the scope of this invention. For that reason, the following claims should be studied to determine the true scope and content of this invention.

What is claimed is:

1. A power distribution circuit comprising;
   a semiconductor switch;
   a current shunt connected to said semiconductor switch;
   a current limit circuit comprising one of an operational amplifier and a comparator, the current limit circuit being connected to a control input of the semiconductor switch and configured to limit a current through the current shunt with the magnitude of precision of the current limiter being dependent on the one of the operational amplifier and the comparator and being in the range of + or −3 Amps;
   an on status detector connected to said semiconductor switch and an on status output line such that a semiconductor on signal is output on said on status output line when said semiconductor switch is on;
   a controller connected to an input power source and to the control input of said semiconductor switch; and
   an overcurrent detection circuit connected to said input power source, said semiconductor switch, and an overcurrent status circuit such that said overcurrent detection circuit is capable of detecting an overcurrent fault in said semiconductor switch.

2. The power distribution circuit of claim 1, wherein a magnitude of precision of the current limiter is dependent on the comparator.

3. The power distribution circuit of claim 1, wherein the current limit has a precision in the range of + or −1.5 Amps.

4. A power distribution circuit comprising;
a semiconductor switch;
a current shunt connected to said semiconductor switch;
a current limit circuit comprising one of an operational amplifier and a comparator, the current limit circuit being connected to a control input of the semiconductor switch and configured to limit a current through the current shunt with the magnitude of precision of the current limiter being dependent on the one of the operational amplifier and the comparator and being less than or equal to 20% of a nominal current limit;
an on status detector connected to said semiconductor switch and an on status output line such that a semiconductor on signal is output on said on status output line when said semiconductor switch is on;
a controller connected to an input power source and to the control input of said semiconductor switch; and
an overcurrent detection circuit connected to said input power source, said semiconductor switch, and an overcurrent status circuit such that said overcurrent detection circuit is capable of detecting an overcurrent fault in said semiconductor switch.

5. The power distribution circuit of claim 4, wherein said overcurrent detection circuit is capable of tripping and latching off said semiconductor switch after detecting an overcurrent condition.

6. The power distribution circuit of claim 4, wherein the current limit has a precision of less than or equal to 15% of the nominal current limit.

7. The power distribution circuit of claim 4, wherein the one of the operational amplifier and the comparator is an operational amplifier.

8. The power distribution circuit of claim 4, wherein the overcurrent status circuit is additionally connected to an overcurrent status signal line and to neutral such that an overcurrent present signal is output on said overcurrent status line when an overcurrent is present on said semiconductor switch.

9. The power distribution circuit of claim 4, wherein said semiconductor switch is a p-channel MOSFET.

10. A method for controlling a switching circuit comprising the steps of;
detecting an overcurrent status of said at least one switching component;
limiting a current through the at least one switching component in response to detecting an overcurrent status of said at least one switching component using a current limit circuit by applying a current limit having a precision of less than or equal to 20% of a nominal current limit; and
overriding a detected on status of said at least one switching component when an overcurrent status is detected.

11. The method of claim 10, wherein said step of overriding said detected on status comprises forcing an on status detector to report the on status of said at least one switching component as off.

12. The method of claim 10, wherein the current limit has a precision of less than or equal to 15% of a nominal current limit.

13. The method of claim 10, wherein the current limit circuit includes one of an operational amplifier and a comparator.

14. The method of claim 13, wherein the current limit circuit includes an operational amplifier.

* * * * *